(12) United States Patent
Tester et al.

(10) Patent No.: US 6,683,551 B1
(45) Date of Patent: Jan. 27, 2004

(54) DIGITAL-TO-ANALOG CONVERTER AND METHOD OF OPERATION

(75) Inventors: David Tester, Preston (GB); Timothy Wilson, Grasscroft (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/219,638

(22) Filed: Aug. 15, 2002

(51) Int. Cl.$^7$ ................................................. H03M 1/66
(52) U.S. Cl. ........................ 341/144; 341/161; 341/159; 341/143
(58) Field of Search ................................ 341/144, 161, 341/118, 168, 159, 143, 156, 136

(56) References Cited

U.S. PATENT DOCUMENTS

| | | | |
|---|---|---|---|
| 4,393,370 A | * 7/1983 | Hareyama | 341/136 |
| 4,843,390 A | * 6/1989 | van Bavel et al. | 341/139 |
| 5,027,120 A | * 6/1991 | Thurston | 341/143 |
| 5,162,799 A | * 11/1992 | Tanimoto | 341/143 |
| 5,392,040 A | * 2/1995 | Hayashi | 341/144 |
| 5,942,999 A | * 8/1999 | Cranford et al. | 341/144 |
| 6,157,335 A | * 12/2000 | Suzuki et al. | 341/144 |
| 6,590,516 B2 | * 7/2003 | Inagaki et al. | 341/144 |

OTHER PUBLICATIONS

Dedic et al, Switching Circuitry, Mar. 6, 2003, Pub. No. US 2003/0043062A1.*

* cited by examiner

*Primary Examiner*—Michael Tokar
*Assistant Examiner*—Lam Mai
(74) *Attorney, Agent, or Firm*—Christopher P. Maiorana, PC

(57) ABSTRACT

The invention may relate to a digital to analog converter. The digital to analog converter may comprise a plurality of controllable current sources and a control circuit. The plurality of controllable current sources may include a first and a second controllable current source. Each of the plurality of controllable current sources may be controllable between a first state and a second state. The control circuit may be coupled to the plurality of controllable current sources. The control circuit may be configured to control digital to analog conversion at a sampling interval. The control circuit may be configured to control a first state transition of the first controllable current source at a timing in the sampling interval different from a second state transition of the second controllable current source.

25 Claims, 8 Drawing Sheets

DIGITAL-TO-ANALOG CONVERTER AND METHOD OF OPERATION

FIELD OF THE INVENTION

The present invention may relate to a digital-to-analog converter (DAC), and may be directed to reducing a settling time of an analog output from the DAC. The invention may be suitable for implementation in an integrated circuit.

BACKGROUND TO THE INVENTION

When an analog output from a DAC changes, the change is not instantaneous but takes a certain time for the output to stabilize. The settling time is the time for the analog output to stabilize to within a certain tolerance, or margin, for example, to within a certain percentage of the final output value.

FIG. 1 depicts schematically a conventional integrated circuit DAC 10, and parasitic impedances at the analog output which increase the settling time undesirably. The DAC 10 includes a semiconductor die 12 including an arrangement of current sources 14 whose outputs are summed. The summed output current (i.e., $I_S$) passes through a leadwire 16, or a leadwire network, to a pin 18 of an integrated circuit package. 17. An analog voltage is developed in a circuit 20 external to the integrated circuit DAC 10 by passing the current through a load resistor 22. The current sources 14 are controlled simultaneously so that, when the output current changes, the current sources produce a substantial step change in $I_S$.

For low current applications, the effect of a parasitic capacitance 24 limits a slew rate of the generated analog voltage. The parasitic capacitance 24 includes the output capacitance of the DAC 10, and capacitances of the external circuit 20. Referring to FIG. 2, the parasitic capacitance slows the rate at which a current (i.e., $I_L$) in the load resistor 22 can change. For a step change in $I_S$, the change in $I_L$ takes the form of an exponential change, defined by an RC time constant where R is the value of the load resistor 22 and C is the value of the parasitic capacitance 24. For low current applications, a high value of the load resistor 24 is often used to enable a reasonable voltage to be developed despite the low current. However, a high load resistor 24 increases the RC time constant, and hence the settling time, undesirably.

For high frequency applications having rapid changes, a higher current is often used to enable the value of the load resistor 24 (and thus the RC time constant) to be reduced. However, for high current applications, a parasitic inductance 26 resulting from the leadwire 16 becomes significant. The parasitic inductance 26, coupled with the parasitic capacitance 24, forms a resonant circuit which creates ringing in the output current $I_L$. Referring to FIG. 3, for a step change in $I_S$, the change in $I_L$ takes the form of an exponentially decreasing ringing superimposed on the exponential change of FIG. 2. The magnitude of the ringing can often be as much as several bits of the DAC resolution. The settling time is adversely affected, because the output $I_L$ does not stabilise until the ringing has decayed.

SUMMARY OF THE INVENTION

The invention may relate to a digital to analog converter. The digital to analog converter may comprise a plurality of controllable current sources and a control circuit. The plurality of controllable current sources may include a first and a second controllable current source. Each of the plurality of controllable current sources may be controllable between a first state and a second state. The control circuit may be coupled to the plurality of controllable current sources. The control circuit may be configured to control digital to analog conversion at sampling intervals. The control circuit may be configured to control a first state transition of the first controllable current source at a timing in the sampling interval different from a second state transition of the second controllable current source.

Features, objects and advantages of the invention include: (i) enabling the settling time to be decreased despite the presence of parasitic impedances; (ii) reducing the effect of parasitic capacitance on DAC output; (iii) reducing the creation of ringing resulting from parasitic impedances; and/or (iv) reducing the effect of parasitic inductance and parasitic capacitance on DAC output. Further features, objects and advantages of the invention will become apparent from the following description, claims and drawings.

BRIEF DESCRIPTION OF THE DRAWINGS

Non-limiting embodiments of the invention are now described by way of example only, with reference to the appended claims and accompanying drawings, in which:

DETAILED DESCRIPTION OF PREFERRED EMBODIMENTS

Figure 4:
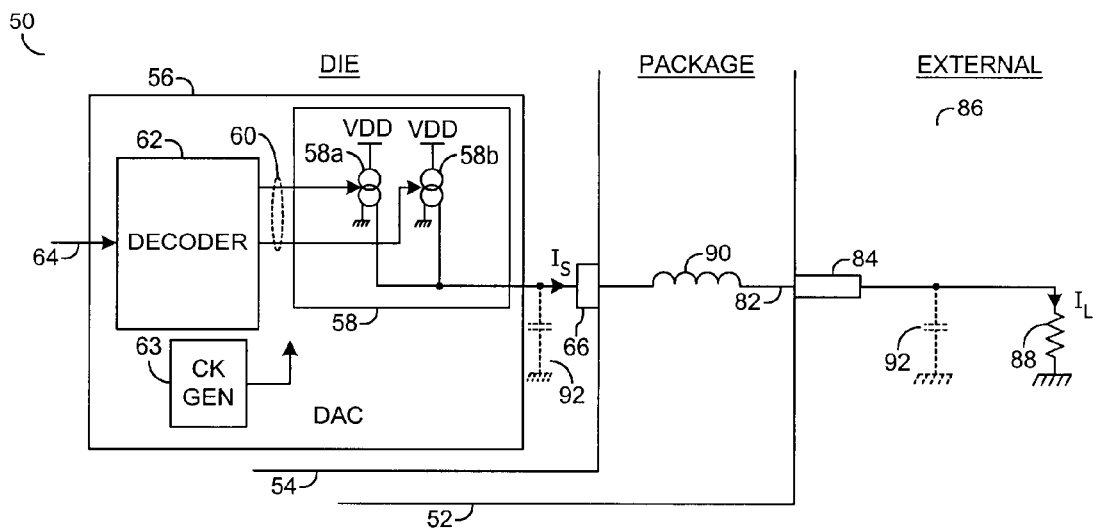
FIG. 4 is a schematic block diagram illustrating a DAC in accordance with a preferred embodiment of the invention.

Referring to FIG. 4, in a preferred (first) embodiment, an integrated circuit 50 may generally comprise a housing or package 52 containing a semiconductor die 54. On the die 54 may be formed a circuit including a DAC 56. The circuit may also include other circuit elements, such as a processor (not shown), memory (not shown) and other interface circuits (not shown), or the circuit may be primarily the DAC 56.

The DAC 56 may generally comprise an arrangement of controllable current sources 58 controlled by respective control signals 60 from a decoder 62. The controllable current sources 58 may be controllable between first and second states. One state may be an "on" state, and the other state may be an "off" state. The controllable current sources 58 may be switchable current sources, as referred to below. For the sake of illustration, only two specific switchable current sources 58a and 58b are shown in FIG. 4, although the number of switchable current sources 58 may be tens, hundreds or thousands. The decoder 62 may be operative to sample a digital input signal 64 and to decode the digital input signal 64 into the plurality of control signals 60 for controlling the current sources 58. The magnitude of the current from each switchable current source 58 may be equal, or the magnitude may vary from one switchable current source 58, or group of switchable current sources 58, to another. The output currents from the current sources 58 may be summed to provide an output current (e.g., $I_S$) at terminal 66 of the semiconductor die. The magnitude of the current $I_S$ at the terminal 66 may be proportional to the magnitude of the digital value of the digital input signal 64. The decoder 62, and a clock signal/timing controller 63 may control the DAC 56 to perform digital to analog conversion at sampling intervals.

Figure 5:
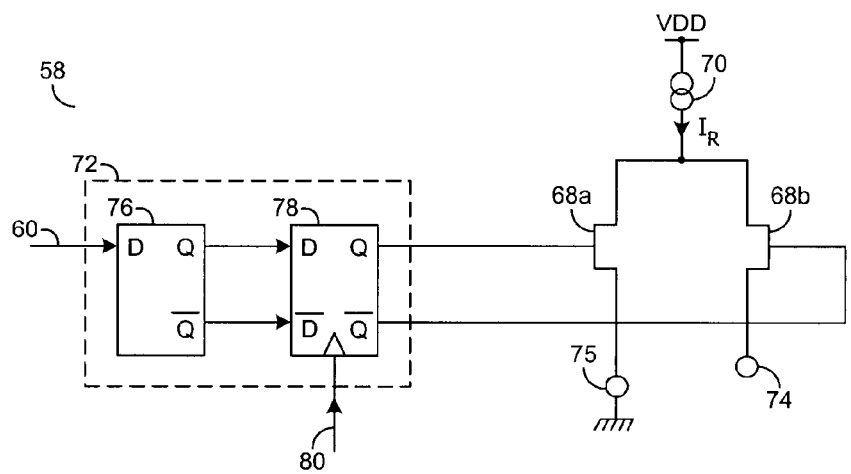
FIG. 5 is a schematic circuit diagram showing a switchable current source used in the DAC of FIG. 4.

Each switchable current source 58 may generally be of a current-steering type, as illustrated in FIG. 5. Referring to FIG. 5, each switchable current source 58 may generally have a first current terminal 73, a second current terminal 74 and a third current terminal 75. The first current terminal 73 may, for example, be coupled to a first voltage supply, for example, VDD. The second and third current terminals 74 and 75 may be terminals to which a current to or from the first terminal 73 is selectively steered. Each switchable current source 58 may generally comprise a differential transistor pair 68a and 68b coupled to a constant or stable current source 70. A current (e.g., $I_R$) delivered by the stable current source 70 from the first terminal 73 may be set by an external reference. The current $I_R$ may be steered through either one or the other of the differential transistors 68a and 68b, depending on differential control signals (e.g., Q and not Q) applied to the differential transistors 68a and 68b from switching logic 72. When the current $I_R$ is steered through one transistor 68b, the current $I_R$ may be fed to the second terminal 74 coupled to the output summing terminal 66 to contribute to the output current $I_S$ from the DAC 56. The switchable current sources 58 may be referred to as switched "on" while contributing to the output current $I_R$. When the current $I_R$ is steered through the other transistor 68a, the current $I_R$ may be sunk internally within the DAC 56, and may not contribute to the output current $I_S$ from the DAC 56. For example, the current $I_R$ may be fed via the third terminal 75 to a second supply voltage, for example, to ground. The switchable current sources 58 may be referred to as switched "off" while not contributing to the output current $I_S$. Such a current-steering circuit may be preferred as "steering" using a differential transistor pair may be faster than switching a stable current source on or off. The switching logic 72 may generally comprise an input latch 76 for latching the control signal 60 from the decoder 62, and a flip-flop 78 coupled between the input latch 76 and the differential transistors 68a and 68b. The flip-flop 78 may receive a clock signal 80 from the decoder 62 for controlling a timing of the application of the control signal 60 to the differential transistors 68a and 68b. The use of such a clock signal 80 may enable the timing of the switchable current sources 58 to be controlled independently of the timing of the control signal 60.

Referring to FIG. 4, a leadwire or a leadwire network 82 may couple the output terminal 66 of the semiconductor die 54 to a connector pin 84 of the package 52 for connection to an external circuit 86. The external circuit 86 may generally include a resistor 88 for developing a voltage proportional to the output current $I_S$ from the DAC 56. Alternatively, the resistor 88 may be implemented on the semiconductor die 54. As explained hereinbefore, the settling time of the output from the DAC (as observed by a current $I_L$ through the resistor 88) may be adversely affected by one or more parasitic impedances, for example, a parasitic inductance 90 and/or parasitic capacitances 92. The parasitic inductance 90 may result from the effect of the leadwire 82. The parasitic capacitance 92 may be a combination of capacitances in the external circuit 86, the package 52, and an output capacitance of the DAC 56.

In the present embodiment, the timing of one of more of the switchable current sources 58 may be controlled to at least partly compensate for the effect of the parasitic impedances. One or more of the switchable current sources 58a may be controlled at a timing different from one or more other switchable current sources 58b. The timing may include switching "on" one or more switchable current sources 58a at a timing different from one of more other switchable current sources 58b, and/or switching "off" one or more switchable current sources 58a at a timing different from one or more other switchable current sources 58b.

Figure 6:
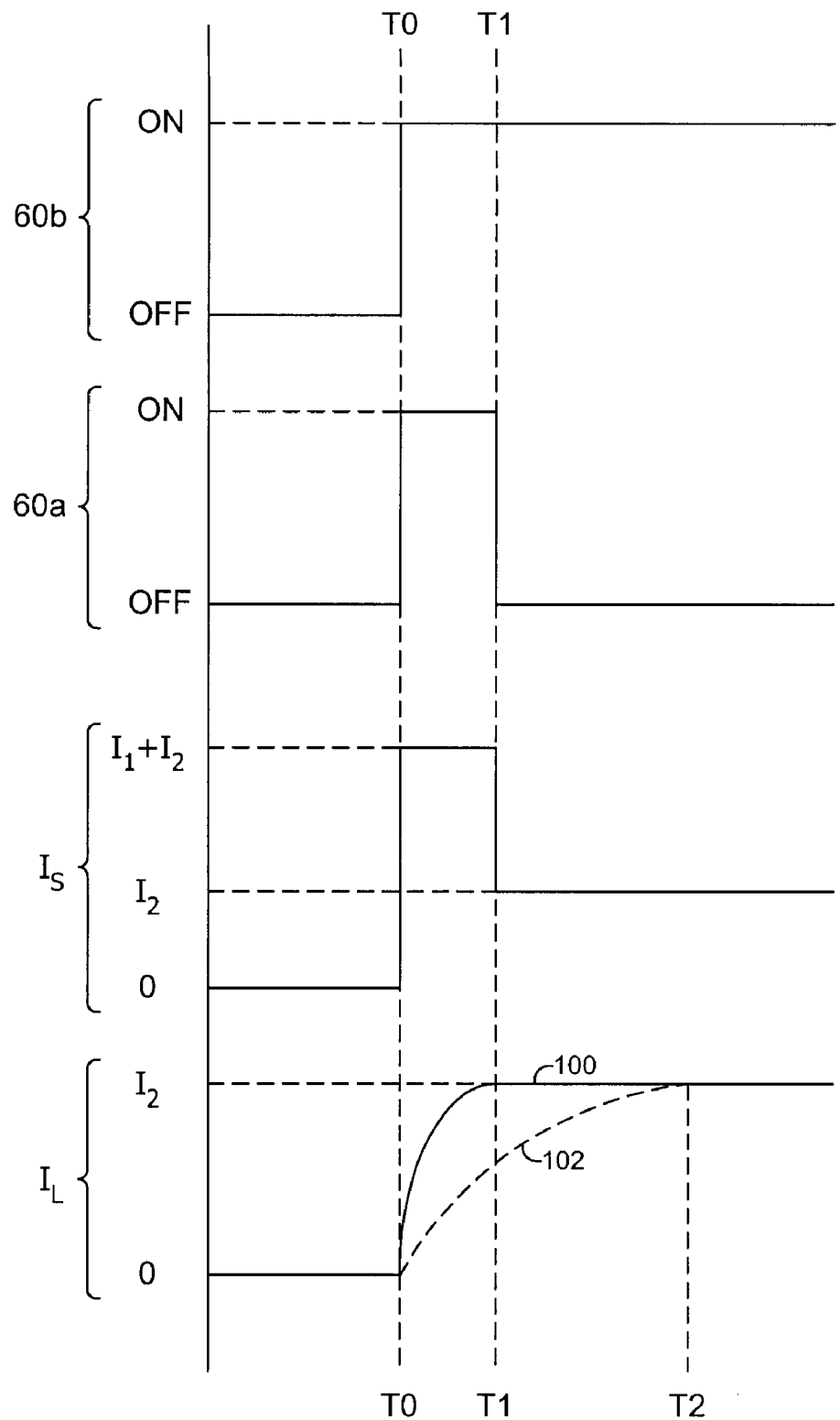
FIG. 6 is a schematic illustration of signals in the DAC of FIG. 4 showing the effect of a momentary boost current.

Referring to FIG. 6, in one form, one or more of the switchable current sources (for example, 58a) may be used to provide a short duration impulse current, also referred to herein as a "boost" current, which may compensate for the effect of parasitic capacitances 92. The boost current may be generated at or near the beginning of a sampling interval. The boost current may reduce the time taken for the parasitic capacitances 92 to charge/discharge. The "boost" current may be turned "on" when initially changing the output current $I_S$, and may be turned off a short period thereafter. For example, in response to a change in the digital signal 64, the decoder 62 may generate a respective control signal 60b for controlling the second switchable control source 58b to transition at time (e.g., T0) at the beginning of a sampling interval, from an "off" state to an "on" state, to generate a respective current (e.g., $I_2$). The second switchable current source 58b may remain in its switched state for at least the majority of the remainder of the sampling interval. In addition, the decoder 62 may generate a respective control signal 60a to control the first current source 58a to turn "on" momentarily between time T0 and a later time (e.g., T1), to generate a momentary boost signal (e.g., $I_1$). The output signal $I_S$ may be $I_1+I_2$ during the period T0 to T1, and may be $I_2$ after the time T1. As indicated by the solid line 100, during the period T0 to T1, the current IL through the resistor 88 may rise more quickly as a result of the combined currents $I_2$, +$I_2$ than merely from the current $I_2$, to provide a shorter settling time. By way of comparison, the broken line 102 may indicate the current $I_L$ resulting merely from the current $I_2$, the broken line 102 having a longer settling time.

The switchable current sources 58 used to provide the momentary boost signal may be one or more of the switchable current sources 58 which may be normally be used to create a stable output current $I_S$. However, in such a case, the switchable current sources 58 available to generate the boost signal may be restricted to only those switchable current sources 58 which are not currently in use to generate the stable output signal. Alternatively, one or more switchable current sources 58 may be dedicated only for generating a momentary boost signal, and not for use in generating a stable output signal.

Figure 7:
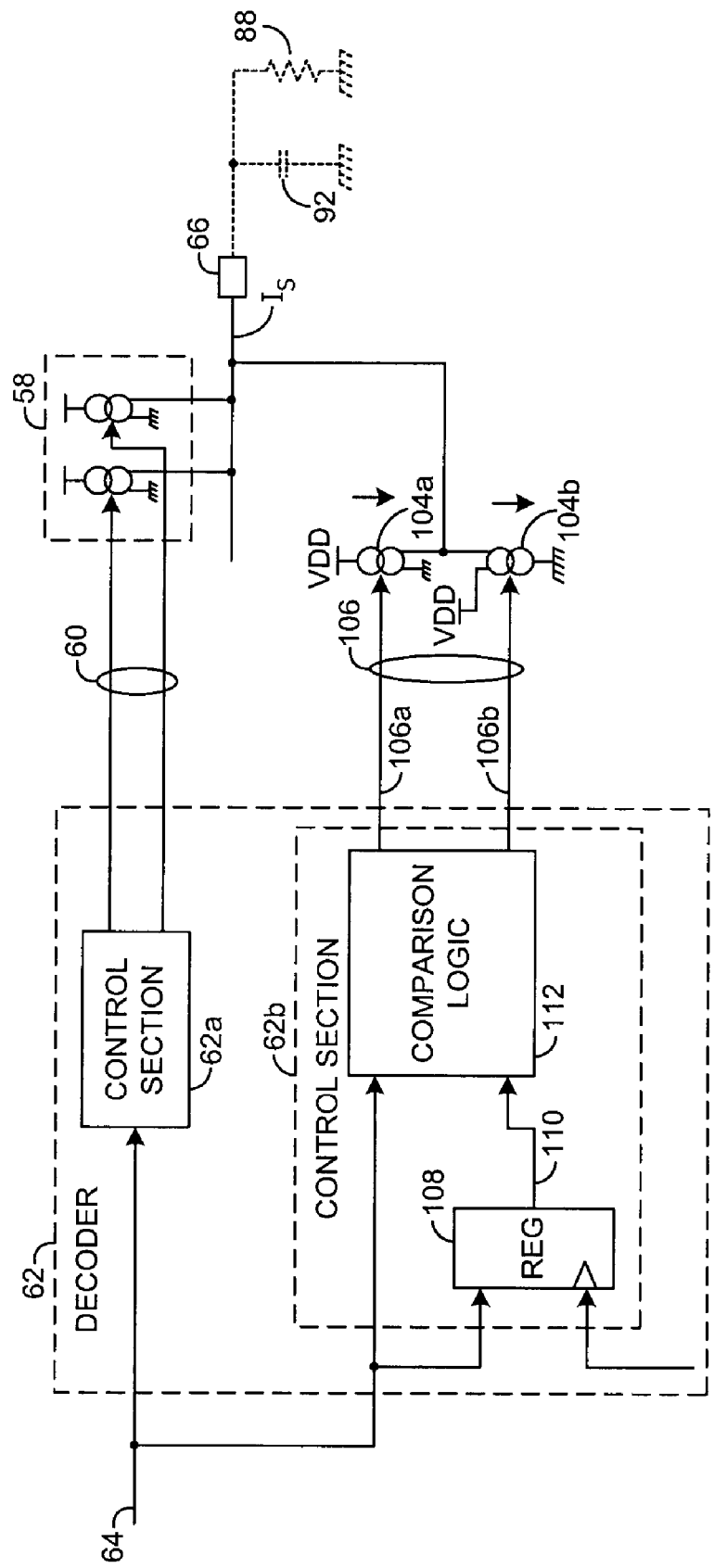
FIG. 7 is a schematic block diagram showing a detail of the DAC in a second embodiment.

FIG. 7 illustrates a second embodiment, similar to the first embodiment, in which dedicated boost or impulse current sources 104a and 104b are provided for generating a momentary boost current signal to supplement the current provided by the switchable current sources 58a and 58b used for generating stable output currents. The boost current sources 104a and 104b may be coupled so that one of the boost current sources 104a may be operative to generate a boost current in a first sense, and the other boost current source 104b may be operative to generate a boost current in an opposite sense. One boost current source 104a may add a boost current to the output current $I_S$, and the other boost current source 104b may be operative to sink a boost current relative to the output current $I_S$. For example, the first boost current source 104a may be coupled with its first terminal (73 in FIG. 5) coupled to a first supply voltage (e.g.,VDD) and its third terminal (75 in FIG. 5) coupled to a second supply voltage (e.g., ground), and the second boost current source 104b may be coupled with its first terminal (73 in FIG. 5) coupled to the second supply voltage (e.g., ground) and its third terminal coupled to the first supply voltage (e.g., VDD).

The decoder 62 may include a first control section 62a for generating respective control signals 60 for controlling the switchable current sources 58a and 58b for generating stable output signals. The control signals 60 may vary in response to the magnitude of the digital input signal 64. The decoder 62 may further include a second control section 62b for generating respective control signals 106a and 106b for controlling the dedicated boost current sources 104a and 104b. The second control section 62b may generally include a register 108 to provide a digital input 110 delayed by one sampling interval, and detection and/or comparison logic 112 for comparing the actual digital input 64 with the delayed input 110. The comparison logic 112 may function to detect whether there may be a change in the value of the digital input signal 64 from one sampling interval to the next, and to detect the magnitude and/or direction of change (for example, whether the change will result in an increase or decrease in the desired stable output current $I_S$) If the change results in an increase in $I_S$, the control signal 106a may be generated to cause the first boost current source 104a to provide a boost signal to increase the current $I_S$ momentarily. The boost current may help to charge the parasitic capacitances 92 quickly, and thereby reduce the settling time of the increased current. If the change results in a decrease in $I_S$, the control signal 106b may be generated to cause the second boost current source 104b to sink current from $I_S$ momentarily. The boost-sink may help to discharge the parasitic capacitances 92 quickly, and thereby reduce the settling time of the decreased current. In general, the control signals 106a and 106b may not be turned on concurrently with each other.

The magnitude of the boost effect may be preset or controlled variably. For example, the magnitude of the boost effect may be controlled by controlling the magnitude of the currents supplied or sunk by the boost current sources 104a and 104b. For example, multiple boost current sources 104a and multiple boost current sources 104b may be provided. The magnitude of the boost current may be controlled by controlling a number of the multiple boost current sources 104a or 104b which are turned on. Additionally, or alternatively, the magnitude of the boost effect may be controlled by controlling a duration for which either of the boost current sources 104a and 104b may be turned on. The second control section 62b may generate control signals 106a and 106b for controlling the magnitude of the boost effect variably depending on the magnitude of the change in the digital input 64. Alternatively, the magnitude of the boost effect may be fixed, and the second control section 62b may determine whether or not to turn on either of the boost current sources 104a and 104b depending on whether the magnitude of the change in the digital input 64 exceeds a certain threshold. A mode of operation of the section control section 62b and of the boost current sources 104a and 104b may be fixed in the design of the control section 62 implemented in the integrated circuit 50 or controllable programmably.

The boost current sources 104a and 104b may be of the same current steering type as the current sources 58 described above, or the boost current sources 104a and 104b may be of a different circuit design. Less importance may be placed on the boost current sources 104a and 104b to deliver a stable current than for the other current sources 58. A function of the boost current sources may be to deliver or sink an "impulse" current. Therefore, boost current sources 104a and 104b may be configured for an impulse current rather than for a stable current.

The principle of applying a short duration boost or impulse current at the output, for example, at the beginning of a sampling interval, to help charge and/or discharge parasitic capacitances affecting the output, may enable a low current DAC 56 to be used with a high value load internal or external resistor 88, without sacrificing settling time. The impulse current may therefore enable a desired settling time to be achieved for a low current, with the consequent advantage of low average power dissipation. The boost or impulse currents may be applied only for short durations when needed in response to a change of the digital input 64. The duration of the boost currents may typically be of the order of nanoseconds (ns). For example, the duration may be between 1 and 100 ns.

Figure 8:
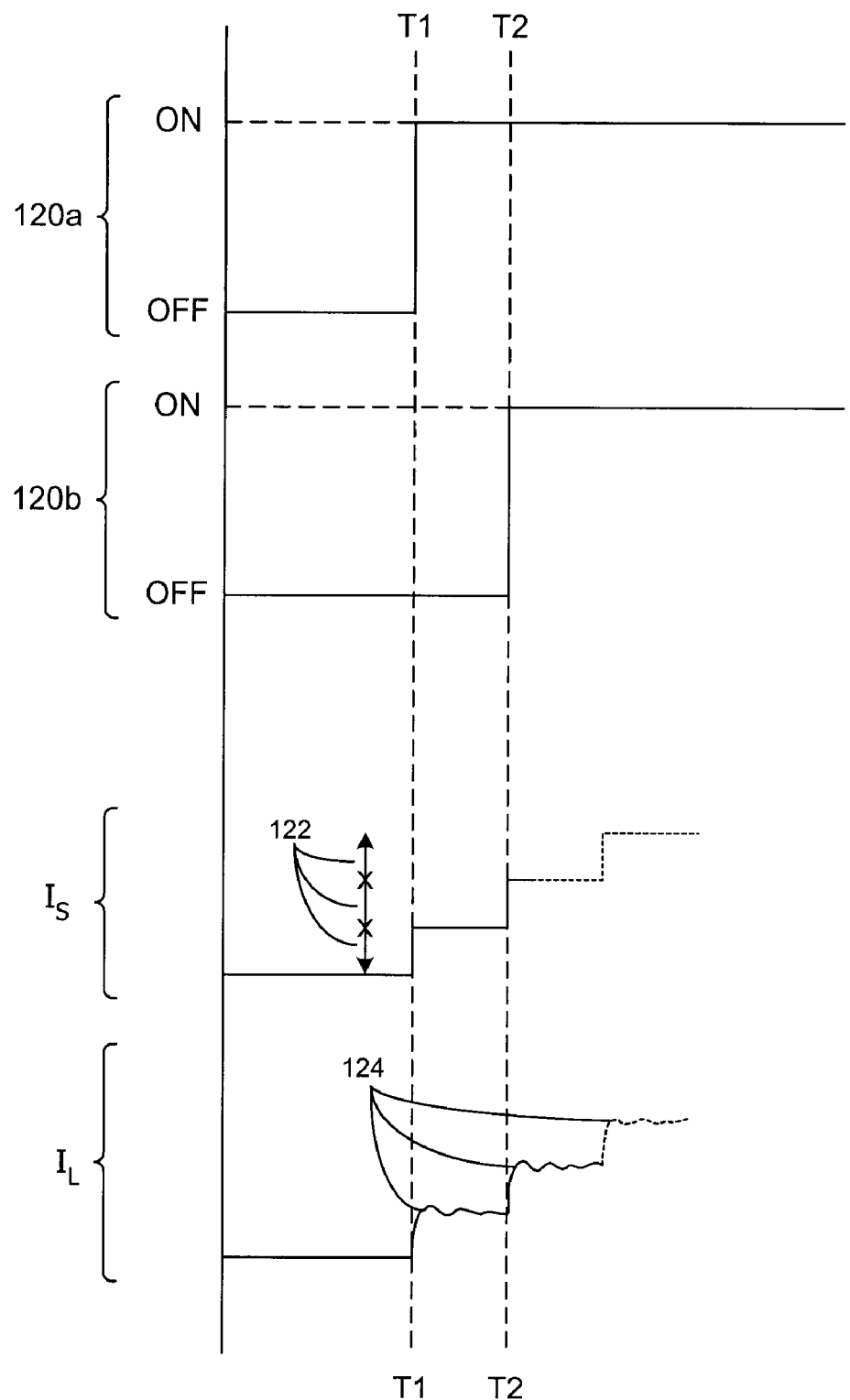
FIG. 8 is a schematic illustration of signals in the DAC of FIG. 4 showing the effect of staggered timing.

FIG. 8 illustrates a further example of turning "on" or "off" the switchable current sources 58a and 58b of the first embodiment, at different timings. The example may be suitable for situations in which the effects of the parasitic inductance 90 and the parasitic capacitances 92 combine to produce ringing in the output current $I_L$ in the load resistor 88. For example, such ringing may occur in relatively high current and/or high frequency DAC applications, for example, for video applications, certain communications and television applications, or where the DAC 56 is generally intended for operation at a clock frequency of about 100 megahertz (MHz) or more. For example, the clock frequency may be of about 135 MHz or more, or of about 200 MHz of more, or of about 250 MHz or more.

Figure 1:
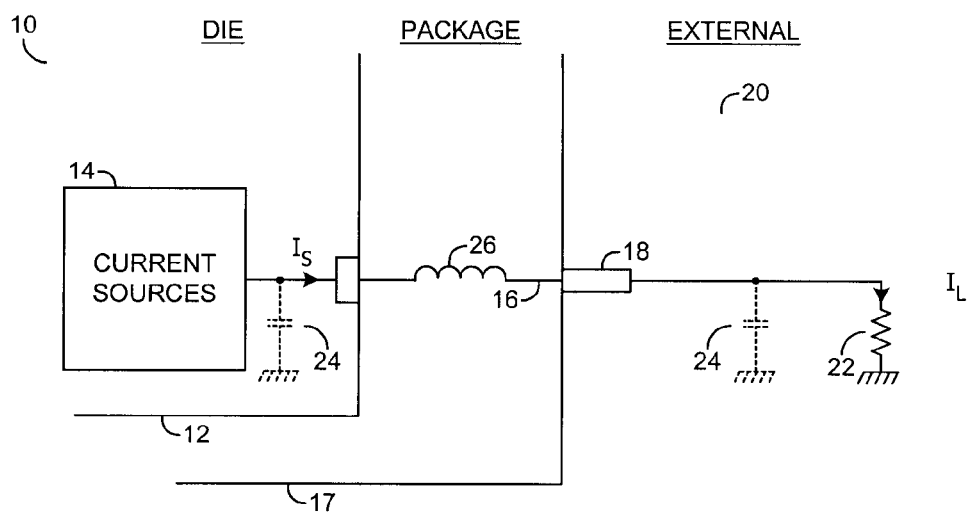
FIG. 1 is a schematic diagram illustrating the sources of parasitic impedances in a conventional DAC.
Figure 2:
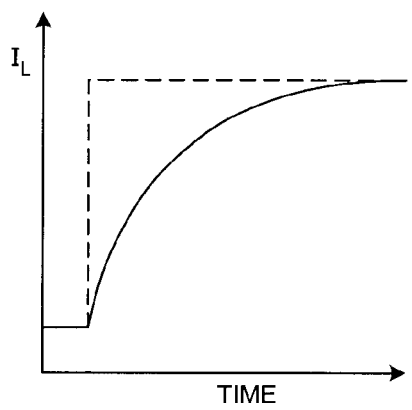
FIG. 2 is a schematic diagram showing the effect of parasitic capacitance at the output of the conventional DAC.
Figure 3:
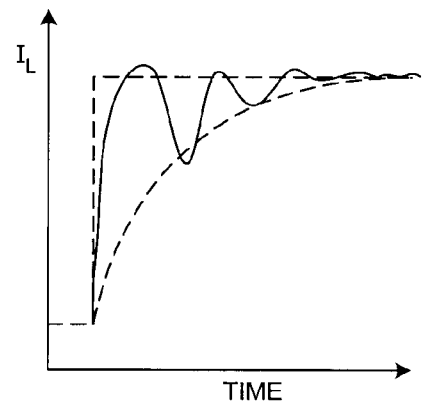
FIG. 3 is a schematic diagram showing the combined effect of parasitic capacitance and parasitic inductance at the output of the conventional DAC.

FIG. 8 may represent a situation in which two or more of the switchable current sources 58a and 58b are to be turned on in the same sampling interval in response to a change in the digital input 64. A first control signal 120a may control the first current source 58a to be turned on at a time (e.g., T1) at or near a beginning of the sampling interval. The first current source 58a may remain on at least for at least a majority of the remainder of the sampling interval. A second control signal 120b may control the second current source 58b to be turned on at a time (e.g., T2) later than T1. The second current source 58b may remain on for at least the majority of the remainder of the sampling interval. One or more other current sources 58 intended to be turned on during the same sampling interval may also be turned on at one or more other timings, near or at the beginning of the sampling interval, but staggered with respect to T1 and/or to T2. The other current sources 58 may remain on for at least the majority of the remainder of the sampling interval. As illustrated in FIG. 8, each time a current source 58 is turned on, the output current $I_S$ may increase by a corresponding small step amount 122. Since at least some of the current sources 58 may be turned on at a staggered timing, the step amounts 122 may be significantly smaller than the single step change that would occur if the same current sources 58 were turned on simultaneously (as in the conventional arrangement of FIG. 3).

Also as illustrated in FIG. 8, each step change 122 in $I_S$ may produce ringing 124 as a result of effect of the parasitic inductance 90 and the parasitic capacitance 92. However, since the step changes 122 may be comparatively small in magnitude, the ringing 124 resulting from each step change 122 may also be comparatively small in magnitude. Also, depending on the respective timing of the staggered step changes 122, the ringing 124 from one step change 122 may be at least partly out of phase with the ringing from another step change 122, and may tend to cancel the ringing at least partly. FIG. 8 generally shows the time axis in a very expanded sense, to illustrate the principles and the effect of the staggering of the timing of the current sources 58. The current sources 58 to be turned on are all turned on at staggered, but closely adjacent times. In general, the times may be spread of a duration which may be less than the equivalent settling time that would be produced were all of the current sources 58 to be turned on simultaneously.

Staggering the timing of plural current sources 58, for example, near or at the beginning of a sampling interval, may therefore produce the surprising result that the ringing may decay more quickly than the corresponding ringing that would be produced by a single step change were the plural current sources 58 to be controlled with the same timing. The quick decay may be surprising because of expectations that staggering the timing of the current sources 58 over a certain period may be counter intuitive to achieving a rapid change in the output. Also, although the above example refers to staggering the timing at which plural current sources 58 are turned on, the same principles may be applied equally to turning off plural current sources 58 at or near the beginning of a sampling interval. An aim may be to stagger the timing to avoid a single large step change that may generate large amplitude ringing in the output.

The control signals 120 may be the control signals 60 from the decoder 62 described previously. Alternatively, the control signals 120 may be distinct from the control signals 60. Distinct control signals 60 and 120 may permit the timing of the switchable current sources 58 to be controlled independently of the addressing of the switchable current sources 58 for controlling whether each current source is to be on or off during the sampling interval. For example, the control signals 120 may be the timing signals 80 described previously.

Figure 9:
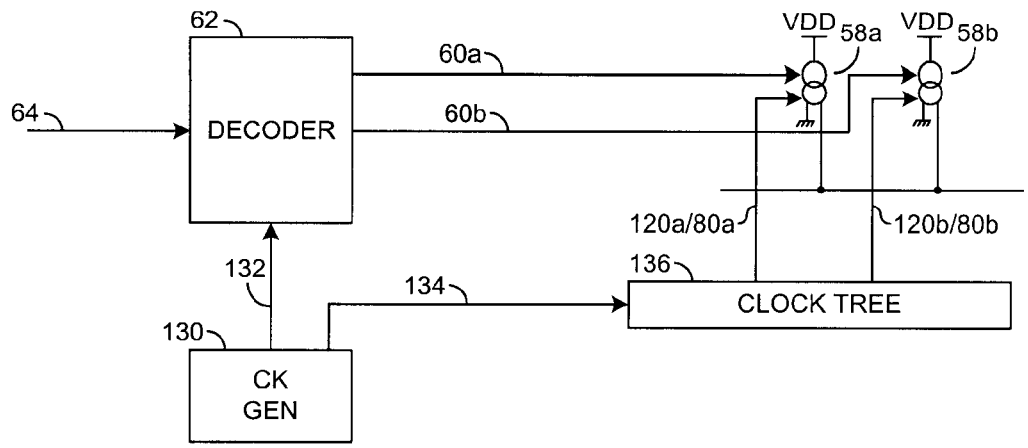
FIG. 9 is a schematic block diagram showing a detail of the DAC in a third embodiment.

FIG. 9 illustrates a third embodiment showing an implementation of a portion of the circuit of FIG. 4, in more detail. A clock generating circuit 130 may generate one or more clock signals for controlling the timing of the DAC 56. A first clock output 132 may control the timing of the decoder 62 for performing decoding operations at predetermined sampling intervals, and for presenting the control signals 60a–b to the switchable current sources 58a–b for determining whether each switchable current source 58a–b will be on or off during the sampling interval. A second clock output 134 may provide the control signals 120a–b (or 80a–b) for controlling the timing at which the control signals 60a–b presented to the switchable current sources 58a–b are acted upon at each switchable current source 58a–b. The second clock output 134 may be fed through a staggered delay network in the form of a non-balanced clock tree path 136 to generate the respective control signals 120a–b with staggered timings.

Figure 10:
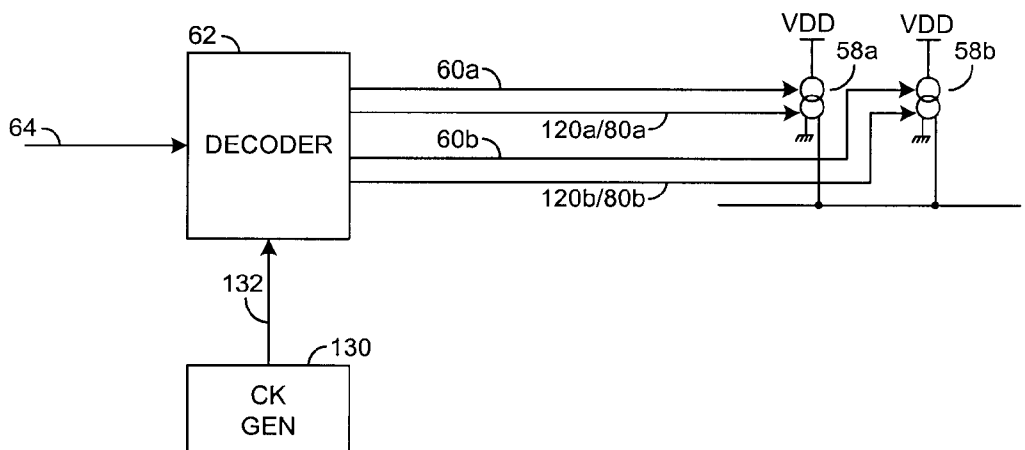
FIG. 10 is a schematic block diagram showing a detail of the DAC in a fourth embodiment.

FIG. 10 illustrates a fourth embodiment showing an implementation of a portion of the circuit of FIG. 4, in more detail. In the fourth embodiment, the decoder 62 may directly generate the control signals 60a–b for addressing each switchable current source 58a–b, and the timing control signals 120/80a–b for controlling the timing of the switchable current sources 58a–b.

Figure 11:
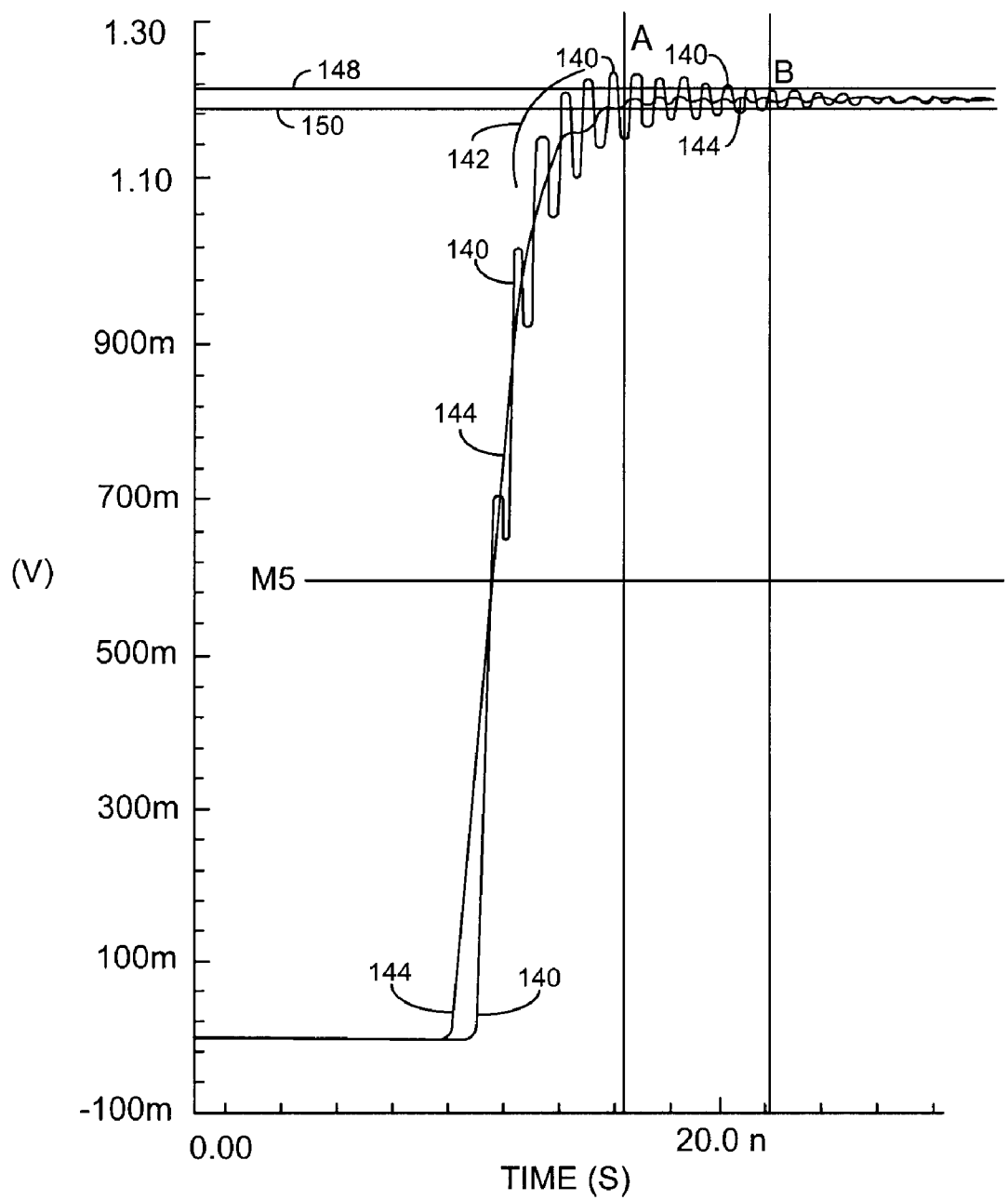
FIG. 11 is a schematic representation of output simulations to compare the effect of staggered and non-staggered timings.
Figure 12:
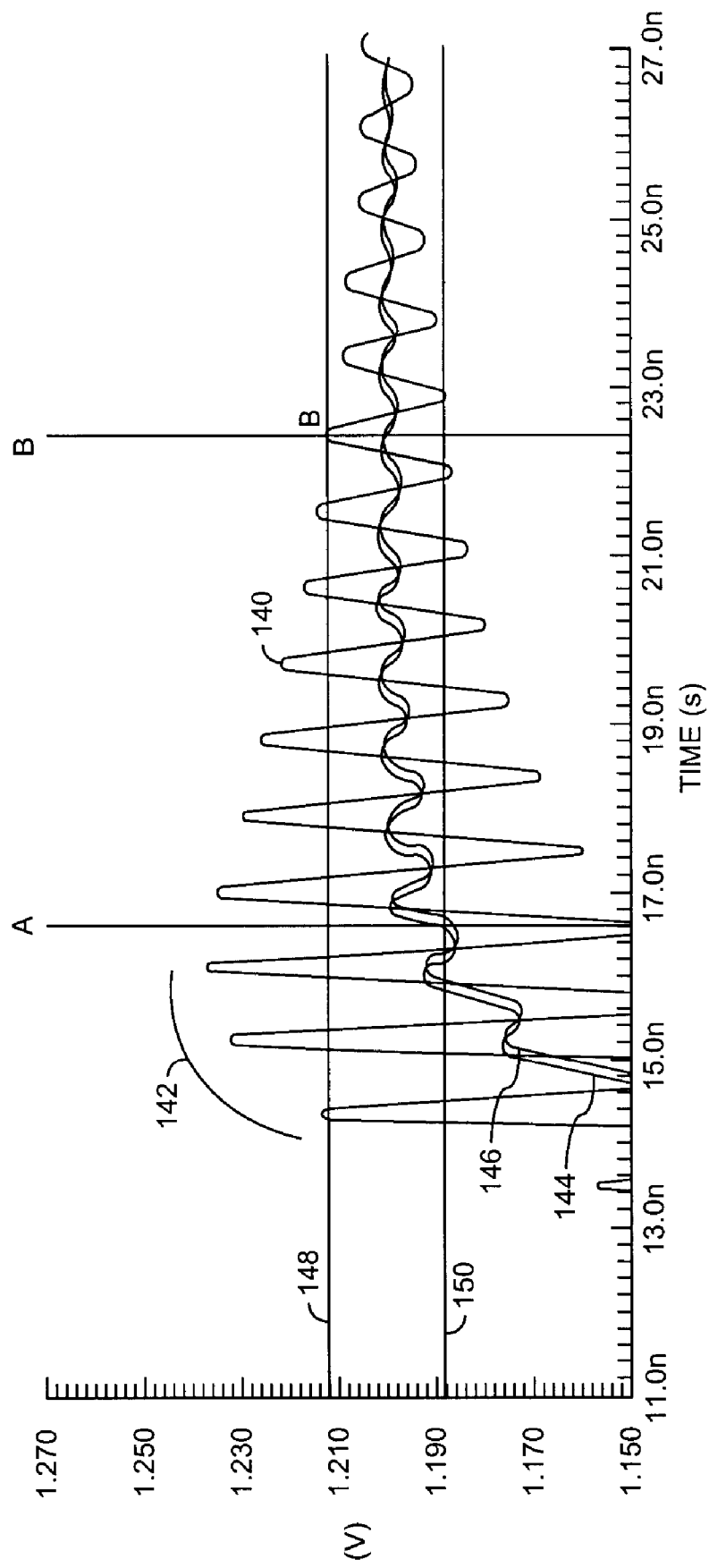
FIG. 12 is a more detailed view of a portion of FIG. 11.

By way of a comparison, FIGS. 11 and 12 may illustrate simulated output responses of an output voltage measured at the internal or external resistor 88, in response to a change in the digital input 64. A first line 140 may represent the output in a first case in which a number (for example, eight) current sources 58 are turned on substantially simultaneously. The first line 140 may include a significant ringing component 142. Levels 148 and 150 may represent two analog voltage levels corresponding to a difference of one bit of precision of the DAC 56. The output 140 may settle to within one bit of precision (e.g., between the levels 148 and 150) at a time B. A second line 144 may represent the output in a second case in which plural current sources 58 (for example, eight current sources) are turned on progressively over a certain time period. The time period may be less than about 10 nanoseconds (ns), preferably less than about 5 ns, for example, about 2 ns. The second line 144 may include substantially less ringing than the first line 140. As illustrated in FIG. 12, the second line 144 may settle towards a stable value significantly more quickly than the first line 140. The output 144 may settle to within one bit of precision (e.g., between the levels 148 and 150) at a time A earlier than time B. The graphs of FIGS. 11 and 12 may demonstrate how, in the second case, staggering the timing of plural current sources 58 may result in a reduced settling time compared to the first case in which the current sources 58 are switched simultaneously. The settling time to B may be about 10 ns, whereas the settling time to point A may be about only 5 ns, an improvement of about 50%. In FIG. 12, a third line 146 may represent a corresponding output in a third case in which a slew rate of a hypothetical single large current source (not shown) is slowed to provide a switching time of about 2 ns (similar to the switching time of the plural current sources 58 in the second case). The third line 146 may be very close to the second line 144. Thus, staggering the timing of plural current sources 58 may have an effect similar to that of slowing a slew rate of a single current source. The result may be less of an instantaneous step change in the output, and consequently less ringing in the output.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time period but the term is not meant to be limited to events that begin at the same point in time, end at the same point in time, or have the same duration. One may appreciate that the foregoing description is merely illustrative of preferred embodiments of the invention, and that many modifications, improvements and equivalents may be used within the scope and principles of the invention.

What is claimed is:

1. A digital to analog converter comprising:
a plurality of controllable current sources including a first and a second controllable current source, each of said plurality of controllable current sources being controllable between a first state and a second state; and a control circuit coupled to said plurality of controllable current sources and configured to (i) control digital to analog conversion at a sampling interval and (ii) control a first state transition of said first controllable current source at a timing in said sampling interval different from a second state transition of said second controllable current source, wherein said control circuit is further configured to (i) switch said first controllable current source to said first state for a duration at a beginning of said sampling interval and (ii) switch said first controllable current source to said second state for a majority of said sampling interval.

2. The digital to analog converter according to claim 1, wherein said control circuit is further configured to switch said second controllable current source to one of said first and said second states for substantially all of said sampling interval.

3. The digital to analog converter according to claim 1, wherein said control circuit comprises:

a detector configured to detect a change in a digital signal received by said digital to analog converter; and an impulse controller configured to control said first current source to switch state momentarily at a beginning of said sampling interval in response to said change.

4. The digital to analog converter according to claim 3, wherein said detector is further configured to detect a magnitude of said change in said digital signal, and said impulse controller is responsive to said detected magnitude.

5. The digital to analog converter according to claim 1, further comprising a third controllable current source of said plurality of controllable current sources configured to provide a current having a sense opposite to a current provided by said first controllable current source.

6. The digital to analog converter according to claim 5, wherein said control circuit comprises:

a detector configured to detect whether a change in a digital signal received by said digital to analog converter corresponds to an increase or a decrease in an analog output; and an impulse controller configured to (i) control said first controllable current source to provide an impulse current in a first sense in response to a detected increase-causing change in said digital signal and (ii) control said third controllable current source to provide an impulse current in an opposite sense to said first sense in response to a detected decrease-causing change in said digital signal.

7. The digital to analog converter according to claim 1, wherein said control circuit is further configured to control said first and said second controllable current sources to switch states at staggered times at a beginning of said sampling interval.

8. The digital to analog converter according to claim 7, wherein said control circuit is further configured to control said first and said second controllable current sources to switch from a same one of said first and said second states to another of said states.

9. The digital to analog converter according to claim 7, wherein said control circuit comprises a delay network for introducing different delays in at least one control signal for controlling said first and said second controllable current sources.

10. The digital to analog converter according to claim 1, wherein at least one of said controllable current sources comprises a switchable current source having said first and said second states as stable states between which said switchable current source is switchable.

11. The digital to analog converter according to claim 10, wherein said switchable current source comprises a current steering circuit for steering current between a first circuit path in said first state and a second circuit path in said second state.

12. The digital to analog converter according to claim 1, wherein at least one of said first and said second controllable current sources comprises:

a first input for receiving a control signal for controlling said state of said controllable current source; and a second input for controlling a timing at which said first input is accepted into said controllable current source.

13. The digital to analog converter according to claim 1, implemented in an integrated circuit.

14. A digital to analog converter comprising:

a plurality of controllable current sources; and a control circuit coupled to said controllable current sources, and configured to (i) control digital to analog conversion at a sampling interval, (ii) control respective ones of said controllable current sources to selectively provide an output current substantially throughout said sampling period, and (iii) control at least one of said controllable current sources to selectively provide an impulse current at a beginning of said sampling interval; and a summing unction for summing currents from said plurality of controllable current sources.

15. The digital to analog converter according to claim 14, wherein said controllable current sources comprise:

a first controllable current source for providing an impulse current in a first sense; and a second controllable current source for providing an impulse current in a second sense opposite to said first sense.

16. The digital to analog converter according to claim 15, wherein said control circuit comprises:

a detector for sensing whether a change in a digital signal received by said digital to analog converter corresponds to an increase or a decrease in an analog output from said digital to analog converter; and an impulse controller for selectively controlling said first and said second controllable current sources in dependence on whether said change corresponds to said increase or to said decrease.

17. The digital to analog converter according to claim 14, wherein said at least one controllable current source used for generating said impulse current is a current source dedicated to producing impulse currents.

18. A digital to analog converter comprising:

a plurality of controllable current sources each being controllable between a first state and a second state; and a control circuit coupled to said controllable current sources and configured to (i) control digital to analog conversion at a sampling intervals and (ii) control respective ones of said controllable current sources to switch from said first state to said second state at different timings at the beginning of said sampling interval, wherein said control circuit is further configured to maintain said respective ones of said controllable current sources in said second state after said switching for substantially a remainder of said sampling interval.

19. The digital to analog converter according to claim 18, wherein one of said first and said second states is an on state and another of said first and said second states is an off state.

20. The digital to analog converter according to claim 18, wherein said control circuit comprises a delay network for supplying at least one control signal to said controllable current sources at different timings.

21. A digital to analog converter comprising:

a plurality of controllable current sources including a first and a second controllable current source, each of said plurality of controllable current sources being controllable between a first state and a second state; and a control circuit coupled to said plurality of controllable current sources and configured to (i) control digital to analog conversion at a sampling interval and (ii) control a first state transition of said first controllable current source at a timing in said sampling interval different from a second state transition of said second controllable current source, wherein said control circuit comprises (i) a detector configured to detect a change in a digital signal received by said digital to analog converter and (ii) an impulse controller configured to control said first current source to switch state momentarily at a beginning of said sampling interval in response to said change.

22. A digital to analog converter comprising:

a plurality of controllable current sources including a first and a second controllable current source, each of said plurality of controllable current sources being controllable between a first state and a second state;

a control circuit coupled to said plurality of controllable current sources and configured to (i) control digital to analog conversion at a sampling interval and (ii) control a first state transition of said first controllable current source at a timing in said sampling interval different from a second state transition of said second controllable current source; and a third controllable current source of said plurality of controllable current sources configured to provide a current having a sense opposite to a current provided by said first controllable current source.

23. A digital to analog converter comprising:

a plurality of controllable current sources including a first and a second controllable current source, each of said plurality of controllable current sources being controllable between a first state and a second state; and a control circuit coupled to said plurality of controllable current sources and configured to (i) control digital to analog conversion at a sampling interval and (ii) control a first state transition of said first controllable current source at a timing in said sampling interval different from a second state transition of said second controllable current source, wherein said control circuit (i) is further configured to control said first and said second controllable current sources to switch states at staggered times at a beginning of said sampling interval and (ii) comprises a delay network for introducing different delays in at least one control signal for controlling said first and said second controllable current sources.

24. A digital to analog converter comprising:

a plurality of controllable current sources each being controllable between a first state and a second state; and a control circuit coupled to said controllable current sources and configured to (i) control digital to analog conversion at a sampling intervals and (ii) control respective ones of said controllable current sources to switch from said first state to said second state at different timings at the beginning of said sampling interval, wherein one of said first and said second states is an on state and another of said first and said second states is an off state.

25. A digital to analog converter comprising:

a plurality of controllable current sources each being controllable between a first state and a second state; and a control circuit coupled to said controllable current sources and configured to (i) control digital to analog conversion at a sampling intervals and (ii) control respective ones of said controllable current sources to switch from said first state to said second state at different timings at the beginning of said sampling interval, wherein said control circuit comprises a delay network for supplying at least one control signal to said controllable current sources at different timings.

* * * * *